United States Patent [19]

Bertho et al.

[11] Patent Number: 5,304,070
[45] Date of Patent: Apr. 19, 1994

[54] EJECTING MEANS IN AN IC PACK CONNECTOR APPARATUS

[75] Inventors: Dominique Bertho, Singapore, Singapore; Paul M. O'Brien, Knockerra, Ireland

[73] Assignee: Molex Incorporated, Lisle, Ill.

[21] Appl. No.: 981,675

[22] Filed: Nov. 25, 1992

[30] Foreign Application Priority Data

Dec. 16, 1991 [DE] Fed. Rep. of Germany ..... 91121499

[51] Int. Cl.[5] ............................................. H01R 13/62
[52] U.S. Cl. ................................... 439/157; 439/159
[58] Field of Search ......................... 439/152–160, 439/372, 64, 65, 326, 327, 328

[56] References Cited

U.S. PATENT DOCUMENTS

| | | | |
|---|---|---|---|
| 4,128,288 | 12/1978 | Zachry et al. | 439/152 |
| 4,778,401 | 10/1988 | Boudreau et al. | 459/157 |
| 4,810,200 | 3/1989 | Sakamoto | 439/155 |
| 4,952,161 | 8/1990 | Komatsu | 459/159 |
| 5,011,420 | 4/1991 | Sakamoto | 439/152 |
| 5,026,296 | 6/1991 | Hashiguchi | 439/159 |
| 5,051,101 | 9/1991 | Komatsu | 439/159 |
| 5,139,435 | 8/1992 | Komatsu | 439/159 |
| 5,145,389 | 9/1992 | Okubo | 439/159 |
| 5,149,276 | 9/1992 | Dixon | 439/159 |
| 5,152,697 | 10/1992 | Abe et al. | 439/152 |
| 5,161,989 | 11/1992 | Okubo et al. | 439/159 |

Primary Examiner—David L. Pirlot
Attorney, Agent, or Firm—Stephen Z. Weiss; Stacey E. Caldwell

[57] ABSTRACT

A connector apparatus includes a header connector (10) of a given thickness into which an IC pack is loaded and from which it is ejected. An ejecting member (16) is mounted on the header connector (10) for ejecting the IC pack from the header connector. The ejecting member (16) is configured to lie substantially within the thickness profile of the IC pack. An actuating member (18) is provided for actuating the ejecting member (16) to eject the IC pack from the header connector. The actuating member is configured to lie substantially within the thickness profile of the header connector (FIG. 1).

8 Claims, 3 Drawing Sheets

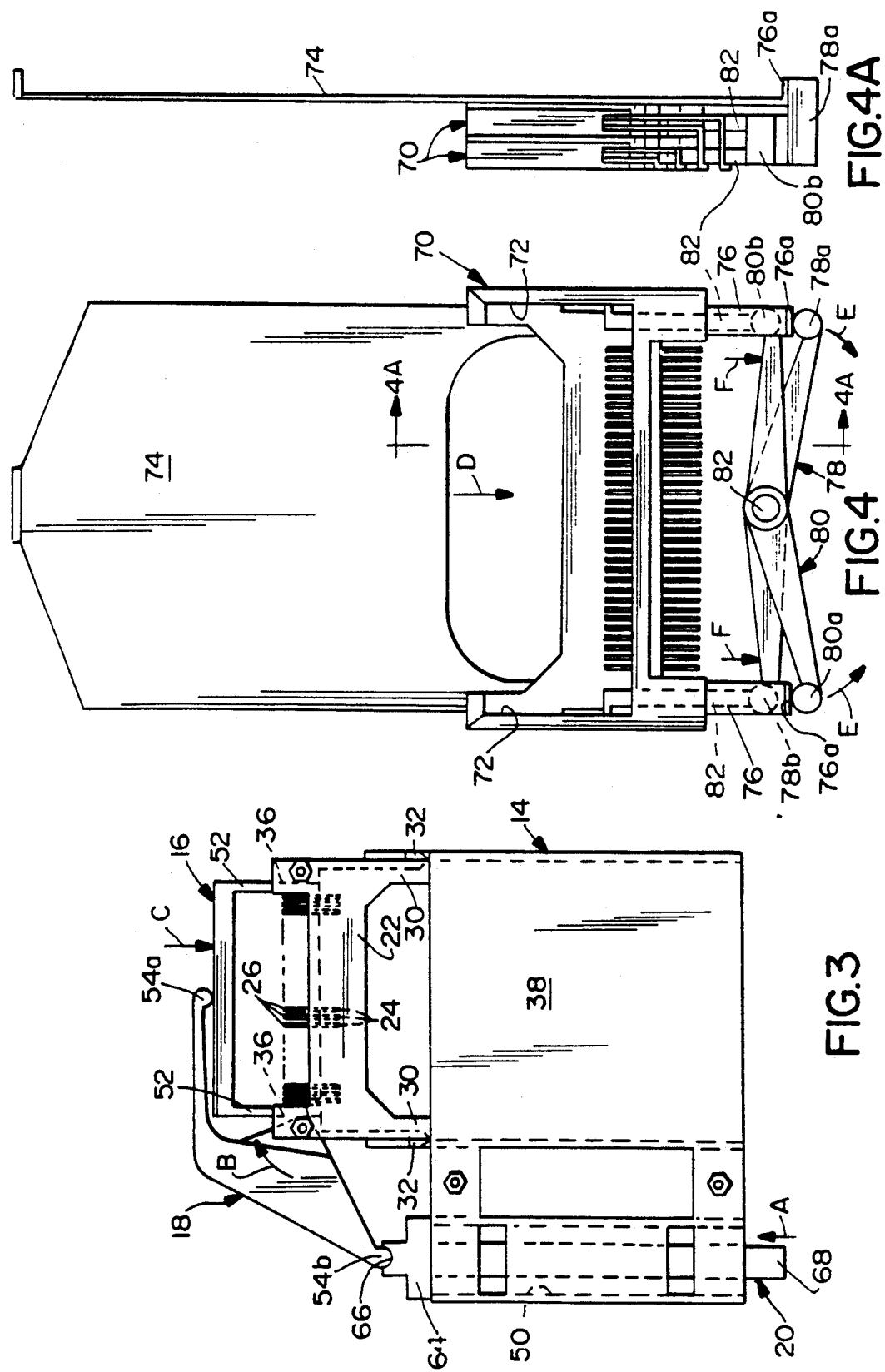

EJECTING MEANS IN AN IC PACK CONNECTOR APPARATUS

FIELD OF THE INVENTION

This invention generally relates to the art of electrical connectors and, particularly, to a connector apparatus having a header connector adapted for receiving an IC pack, with means for ejecting the IC pack from the header connector.

BACKGROUND OF THE INVENTION

Header connectors are used with IC packs or memory cards, and are provided with various attachments, such as means for facilitating ejection or removal of the IC pack for replacement. The header connector is used for interconnecting the semiconductor circuit of the IC pack to an external circuit such as a main electronic unit. The IC pack is inserted into the header connector and is extracted therefrom as needed. The pulling force to extract the IC pack, i.e. the force between the respective pins disposed in the header connector and the respective terminals of the IC pack, must be relatively large due to the tight fit required to obtain a good electrical contact. When the IC pack is extracted by hand, the pack often is extracted in an oblique direction which may damage the respective terminals or contacts.

Consequently, a variety of ejecting mechanisms have been incorporated in various connector apparatus for facilitating ejecting an IC pack from a header connector. One of the problems with using ejecting mechanisms is that they add to the overall size or dimensions of the apparatus envelope. There are various applications where it is desirable to maintain as low a profile for the overall connector apparatus as possible, such as where it may be desirable to stack a plurality of header connectors. It is difficult to maintain a low profile when various attachments, such as ejecting mechanisms, are disposed outside of the header connector profile, particularly outside the thickness of the header connector. It is difficult to reduce the thickness of the header as a whole and, consequently, extraneous attachments add to the overall envelope of the connector apparatus.

This invention is directed to solving these problems by providing an improved ejecting means in a connector apparatus for ejecting an IC pack from a header connector, the ejecting means being confined substantially within the thickness profile of the IC pack or, at least, within the thickness profile of the header connector.

SUMMARY OF THE INVENTION

An object, therefore, of the invention is to provide a new and improved ejecting means in a connector apparatus for ejecting an IC pack from a header connector.

In the exemplary embodiments of the invention, a connector apparatus includes a header connector of a given thickness into which an IC pack of a given thickness is loaded and from which it is ejected. Housing means are provided for receiving and holding the header connector. Generally, ejecting means are mounted on one of the header connector and housing means for ejecting the IC pack from the header connector. The ejecting means is configured to lie substantially within the thickness profile of the IC pack. Means are provided for actuating the ejecting means to eject the IC pack from the header connector.

In one embodiment of the invention, the ejecting means is provided in the form of a generally U-shaped member substantially the same thickness as the IC pack. The U-shaped member has legs for engaging opposite ends of the IC pack so that the pack is ejected in a constant direction. The actuating means include a lever pivotally mounted on the header connector intermediate opposite ends thereof, one end of the lever engaging the U-shaped member. Activating means are provided in the form of a push rod for engaging the opposite end of the lever. Preferably, the lever has a thickness approximately equal to that of the U-shaped member and the IC pack, and the push rod has a thickness no greater than that of the header connector.

In another embodiment of the invention, the actuating means include a pair of levers pivotally interconnected intermediate their ends in a scissors fashion. One end of each lever respectively engages one of opposite ends of the ejecting means. The opposite ends of the levers are engageable by an activating means. In the disclosed embodiment, the activating means is in the form of a plate having flanges for engaging the opposite ends of the levers.

In a further embodiment of the invention, ejecting means are engageable with opposite ends of the IC pack and the actuating means include a pair of levers pivoted intermediate their ends. One lever is short and the other lever is long whereby one end of each lever is engageable with the ejecting means at a respective opposite end of the IC pack, and adjacent opposite ends of the levers are located outside an end of the IC pack for engagement by an activating means. In the disclosed embodiment, the activating means is provided in the form of a push rod effectively engageable with the adjacent opposite ends of the levers.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 3 is a top plan view of the connector apparatus of FIG. 1 in assembled condition;

FIG. 4A is a schematic top plan view of a second embodiment of the invention;

FIG. 4 is a section taken generally along line 4A—4A of FIG. 4;

DETAILED DESCRIPTION OF THE PREFERRED EMBODIMENT

Figure 1:
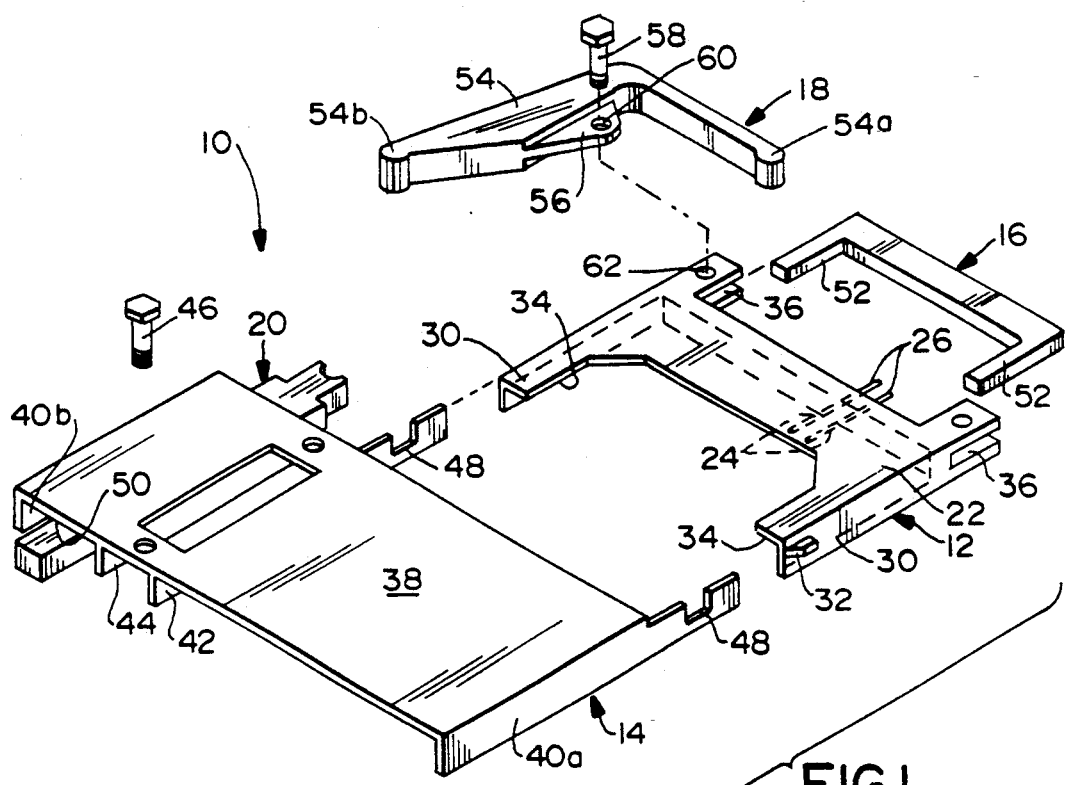
FIG. 1 is an exploded perspective view of a first embodiment of a connector apparatus incorporating the concepts of the invention.

Referring to the drawings in greater detail, and first to FIG. 1, the embodiment of the invention illustrated therein is incorporated in a connector apparatus, generally designated 10; which includes a header connector, generally designated 12; a housing means, generally designated 14; an ejecting means, generally designated 16; an actuating means, generally designated 18; and an activating means, generally designated 20.

Figures 2, 2A:
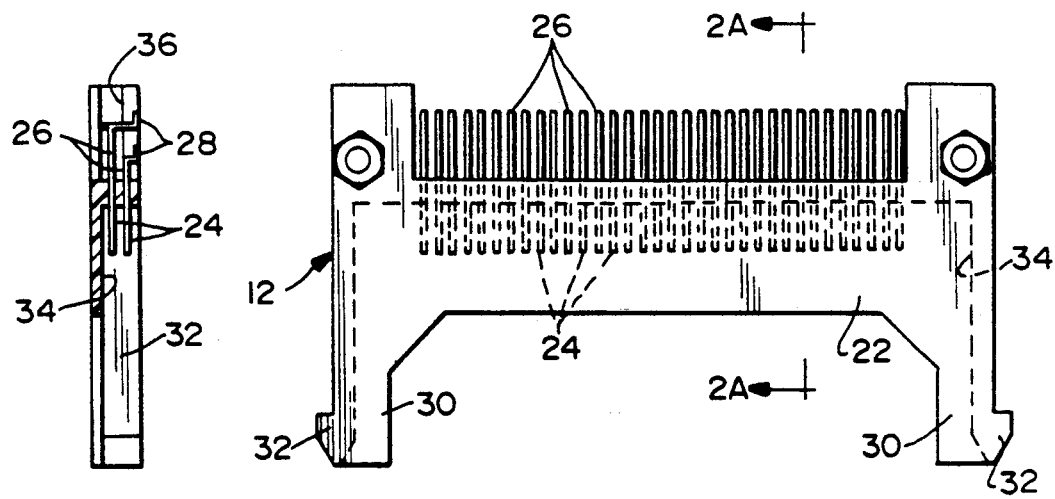
FIG. 2 is a top plan view of the header connector of the connector apparatus.
FIG. 2A is a section taken generally in the direction of line 2A—2A of FIG. 2.

Referring to FIG. 2 in conjunction with FIG. 1, header connector 12 includes an insulating header housing 22 integrally molded of dielectric material such as plastic. The header housing mounts a plurality of high density terminals which include pin portions 24 for insertion into contact sockets of an IC pack, and solder tail portions 26 for insertion into holes in a printed circuit board or to be surface mounted to circuit traces on the printed circuit board, as at 28 in FIG. 2A. Header housing 22 has a pair of arms 30 with outwardly protruding latch projections 32. The housing defines an interior receptacle 34 for receiving an IC pack terminated to pin portions 24 of the terminals. The header housing also has slots 36 within which ejecting means 16 (FIG. 1) is reciprocally removable. The IC pack is not shown in the drawings, but it has a conventional flat configuration with sockets at one edge for receiving terminal pin portions 24. The IC pack has a thickness no greater than that of interior receptacle 34.

As seen in FIG. 1, housing means 14 is fabricated having a generally inverted U-shape cross section and includes a top wall portion 38, opposite side wall portions 40a and 40b and inner wall portions 42 and 44. Housing means 14 is adapted for mounting on top of a printed circuit board, as by means of a appropriate fasteners 46. Outside wall 40a and inner wall 42 extend beyond top wall 38 and are provided with notches 48 into which latch projections 32 of header connector 12 are engageable in assembly of the connector apparatus. Outside wall 40b and inner wall 44 define a channel 50 within which activating means 20, which is provided in the form of a push rod, is reciprocally disposed.

Ejecting means 16 is provided in the form of a generally U-shaped member including a pair of legs 52. The legs project into slots 36 of header housing 22. It can be seen that the U-shaped ejecting member has a thickness which lies substantially within the thickness profile of an IC pack in receptacle 34 and, in fact, is thinner than the thickness of header housing 22.

Actuating means 18 is provided in the form of a lever 54 having opposite ends 54a and 54b. The lever is pivotally mounted on header housing 22 by means of a flange 56 which projects into one of the slots 36, with a pivot bolt 58 extending freely through a hole 60 in flange 56 and a hole 62 in the header connector. Actuating lever 54 has a thickness on the order of that of ejecting U-shaped member 16 whereby the lever is disposed in the thickness profile of an IC pack. At least, the thickness of the lever is not greater than that of header connector 12. The same holds true for the thickness of activating push rod 20.

Referring to FIG. 3, the components of connector apparatus 10, described above in relation to FIG. 1, are shown in assembled condition. It can be seen that latch projections 32 on arms 30 of header housing 22 have been snapped into notches 48 of housing means 14. Legs 52 of U-shaped ejecting member 16 have been inserted into slots 36 in header connector 12, and actuating lever 18 has been pivotally mounted to the header connector. In this view, it can be seen that activating push rod 20 has an enlarged portion 64 which rides in channel 50 of housing 14 to stabilize movement of the push rod, and the enlarged portion has a socketed portion 66 for engaging a rounded end 54b of actuating lever 18, as the opposite end 54a of the lever engages U-shaped ejecting member 16.

In operation of the embodiment of the invention shown in FIGS. 1-3, and still referring to FIG. 3, in order to eject an IC pack from header connector 12, a user pushes on an exposed end 68 of activating push rod 20, as indicated by arrow "A". The push rod pivots actuating lever 18 in the direction of arrow "B". By engagement of end 54a of the lever with U-shaped ejecting member 16, pivoting action of the lever moves the ejecting member in the direction of arrow "C" whereupon the distal ends of legs 52 engage the IC pack to eject the pack from the connector header and out of interconnection with pin portions 24 of the header terminals.

FIG. 4, along with FIG. 4A, shows a second embodiment of the invention in a schematic illustration and includes a header connector, generally designated 70, which is very similar to header connector 12 (FIGS. 1-3) except that the header connector has a recessed area 72 on the top thereof for receiving a plate-like activating member 74 which serves the purpose of push rod 20 of the embodiment of the invention shown in FIGS. 1-3. The activating plate has a pair of extended arms 76 with flanges 76a at the distal ends thereof.

In the embodiment of the invention shown in FIGS. 4 and 4A, the actuating means is provided in the form of a pair of levers 78 and 80 appropriately pivotally connected intermediate their ends on a common pivot 82, as to a PC board. Lever 78 has opposite ends 78a and 78b, and lever 80 has opposite ends 80a and 80b. Ends 78a and 80a of levers 78 and 80, respectively, are provided in the form of post portions as seen in FIG. 4A for engagement by flanges 76a of activating plate 74. The opposite ends 78b and 80b of actuating levers 78 and 80, respectively, engage a pair of ejecting rods 82 which, in turn, engage opposite ends of an IC pack inserted into header connector 70.

As seen in FIG. 4A, a pair of header connectors 70 are arranged in a stacked array with the tail portions of the terminals of one header connector being longer than that of the other for surface mounting to a printed circuit board. Consequently, a pair of ejecting rods 82 are provided at each opposite end of each header connector for ejecting two IC packs simultaneously from the header connectors. To that end, ends 78b and 80b of actuating levers 78 and 80, respectively, also are formed by post-like portions at the distal ends of the levers for engaging both ejecting rods 82 at the respective end of the header connector.

In operation of the connector apparatus shown in FIGS. 4 and 4A, activating plate 74 is moved in the direction of arrow "D" whereby flanges 76a engage ends 78a and 80a of actuating levers 78 and 80, respectively. That action moves those ends of the levers in the direction of arrows "E". Consequently, the opposite ends 78b and 80b of the levers are pivoted in a scissors fashion in the direction of arrows "F". Ejecting rods 82 thereby are moved in the direction of arrows "F" to engage opposite ends of two IC packs to eject the packs from the stacked header connectors.

Figure 5A:
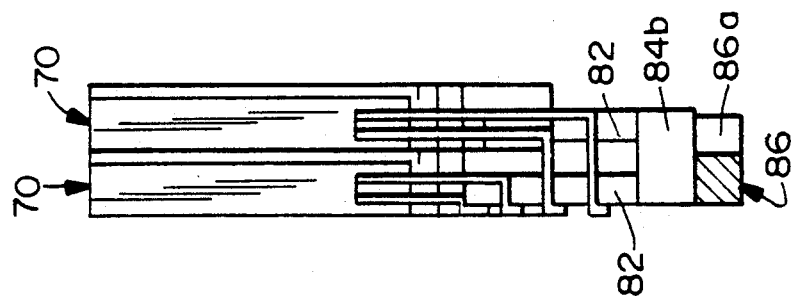
FIG. 5A is a section taken generally along line 5A—5A of FIG. 5.
Figure 5:
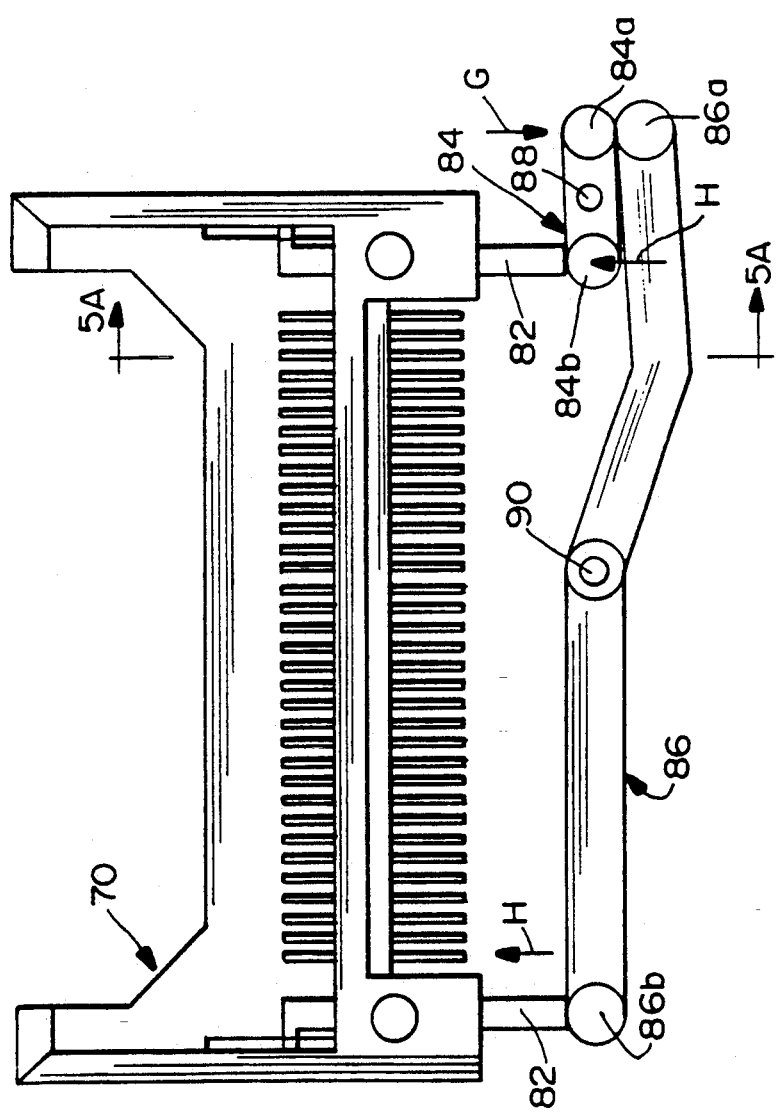
FIG. 5 is a schematic top plan view of a third embodiment of the invention.

FIGS. 5 and 5A show an ejecting and actuating means of a third embodiment of the invention, again in a schematic illustration. More particularly, a pair of stacked header connectors 70 each reciprocally mount of pair of ejecting rods 82 as described in relation to FIGS. 4 and 4A. Instead of the scissors-type levers 70 and 80 in the embodiment of FIGS. 4 and 4A, the embodiment shown in FIGS. 5 and 5A include a pair of levers, generally designated 84 and 86, both levers being pivotally mounted to a printed circuit board intermediate their ends, as at 88 and 90, respectively. Levers 84 and 86 have adjacent proximal ends 84a and 86a, respectively, and spaced distal ends 84b and 86b, respectively. Ends 84b and 86b of the levers are positioned for respectively engaging one of ejecting rods 82. Although not shown in the drawings, an appropriate activating means, such as the push rod activating means 20 of the embodiment of the invention shown in FIGS. 1–3, may be employed for effectively engaging ends 84a and 86a of the levers, as indicated by arrow "G" (FIG. 5).

In operation of the embodiment of the invention shown in FIGS. 5 and 5A, when an activating means, such as a push rod, is moved in the direction of arrow "G" against ends 84a and 86a of the levers, the opposite ends 84b and 86b of the levers are pivoted about their respective pivot points 88 and 90, respectively, in the direction of arrows "H", to engage ejecting rods 82 which, in turn, engage opposite ends of an IC pack to eject the pack from header connector 70. In the embodiment shown, with two header connectors arranged in a stacked array, the IC packs from both connectors are ejected simultaneously.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A connector apparatus for providing an interconnection between two IC packs and a single printed circuit board, said connector apparatus comprising:
   a pair of vertically stacked headers (70) having a given overall thickness, each including a dielectric housing having an IC pack receiving opening, and each mounting a plurality of terminals adapted for interconnection of one IC pack to electrical traces on the printed circuit board,
   each of said IC packs being inwardly and outwardly movable within the respective headers between an inserted position wherein the IC pack electrically mates with the terminals and an ejected position wherein a portion of the IC pack extends outside the opening;
   an ejector mechanism for selectively moving the IC packs from the inserted position to the ejected position, said ejector mechanism being configured to lie substantially within the thickness profile of the vertically stacked headers, and having two ejector arms defining a pair of levers (78, 80) pivotally interconnected intermediate their ends in a scissors fashion; and
   a manually manipulatable actuator (74) slidably mounted within one of the housings and associated with the ejector arms to move the IC packs simultaneously outwardly to the ejected position,
   whereby when said IC packs are in the inserted position and the actuator is moved in the direction of insertion of the IC packs, one end (78b, 80b) of each lever respectively effects ejection of one IC pack, and the opposite end (78a, 80a) of each lever is engageable with the actuator.

2. The connector apparatus of claim 1 wherein the actuator is in the form of a plate (74) having a flange (76a) for engaging said opposite ends (78a, 80a) of the levers (78,80).

3. A connector apparatus for providing an interconnection between two IC packs and a single printed circuit board, said connector apparatus comprising:
   a pair of vertically stacked headers (70) having a given overall thickness, each including a dielectric housing with an IC pack receiving opening, and each mounting a plurality of terminals adapted for interconnection of one IC pack to electrical traces on the printed circuit board,
   each of said IC packs being inwardly and outwardly movable within the respective headers between an inserted position wherein the IC pack electrically mates with the terminals and an ejected position wherein a portion of the IC pack extends outside the opening;
   an ejector mechanism for selectively moving the IC packs for the inserted position to the ejected position, said ejector mechanism being configured to lie substantially within the thickness profile of the vertically stacked headers, and having two ejector arms defining a pair of levers (84, 86) pivotally mounted intermediate their ends, one lever (84) being short and the other lever (86) being long; and
   a manually manipulatable actuator (20) slidably mounted within one of the housings and associated with the ejector arms to move the IC packs simultaneously outwardly to the ejected position,
   whereby one end (84b, 86b) of each lever effects ejection at a respective opposite end of said two IC packs and adjacent opposite ends (84a, 86a) of the levers are adapted for engagement by the actuator.

4. The connector apparatus of claim 3 wherein the actuator is in the form of an elongated push rod (20) effectively engageable with said adjacent opposite ends of the levers (84,86).

5. A connector apparatus (10) for providing an interconnection between an IC pack and a printed circuit board, said connector apparatus including:
   a dielectric header (12) of a given thickness disposed at one end of the connector apparatus, said header having a plurality of terminals (26) mounted therein adapted for interconnection of the IC pack of electrical traces on the printed circuit board;
   a housing (14) axially spaced from the header in a direction opposite the direction of insertion of the IC pack, the housing having an IC pack-receiving opening at an opposite end of the connector apparatus, and further having an integrally formed channel (50) therein laterally spaced from the opening,
   said IC pack being inwardly and outwardly movable within the housing (14) between a forward, inserted position wherein it electrically mates with the terminals of the header and a rearward, ejected position wherein a portion of the IC pack extends outside the opening; and
   an ejector mechanism for selectively moving the IC pack outwardly from the inserted position to the ejected position, said ejector mechanism being configured to lie substantially within the thickness profile of the header, said ejector mechanism including

- an ejector arm (18) for effecting movement of the IC pack to the ejected position, and
- a manually manipulatable actuator (20) pivotally associated with said ejector arm slidably mounted within the integrally formed channel of the housing;

the improvement in said connector apparatus comprising:

said ejector mechanism further includes a generally U-shaped member (16) axially spaced from the header in the direction of insertion of the IC pack, the U-shaped member having legs (52) the distal ends of which engage the IC pack;

said ejector arm defines a unitary lever (54) disposed laterally of the header, and having a first end (54b) and a second end (54a), the lever being pivotally mounted intermediate said first and second ends, wherein the first end (54b) of the unitary lever (54) engages the actuator (20) and the second end (54a) of the lever engages the U-shaped member (16), whereby when said IC pack is in the inserted position and the actuator is moved in the direction of insertion of the IC pack, the lever pushes the U-shaped member in the direction opposite the direction of insertion of the IC pack which in turn pushes the IC pack outwardly to the ejected position.

6. The connector apparatus of claim 5 wherein said lever (18) is pivotally mounted on the header (12).

7. The connector apparatus as set forth in claim 5 wherein the U-shaped member (16) is molded of dielectric material.

8. The connector apparatus as set forth in claim 5 wherein the unitary lever is generally V-shaped, wherein a first leg of the V is generally parallel to the bight portion of the U-shaped member (16) when the IC pack is in its inserted position, and wherein the lever is pivotally mounted along the second leg of the V.

* * * * *